US008624668B2

(12) United States Patent
Wan et al.

(10) Patent No.: US 8,624,668 B2
(45) Date of Patent: Jan. 7, 2014

(54) COMMON-MODE STEP RESPONSE FOR AUTOZERO AMPLIFIERS

(75) Inventors: Quan Wan, Belmont, MA (US); Alasdair G. Alexander, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 45 days.

(21) Appl. No.: 13/325,750

(22) Filed: Dec. 14, 2011

(65) Prior Publication Data

US 2013/0015916 A1    Jan. 17, 2013

Related U.S. Application Data

(60) Provisional application No. 61/506,857, filed on Jul. 12, 2011.

(51) Int. Cl.
*H03F 1/02* (2006.01)
(52) U.S. Cl.
USPC ............................................................. 330/9
(58) Field of Classification Search
USPC .................................. 330/9, 11; 327/124, 307
See application file for complete search history.

(56) References Cited

U.S. PATENT DOCUMENTS

| | | | |
|---|---|---|---|
| 4,190,805 A | 2/1980 | Bingham | |
| 4,633,223 A | 12/1986 | Senderowicz | |
| 4,808,942 A | 2/1989 | Milkovic | |
| 6,476,671 B1 | 11/2002 | Tang | |
| 6,498,530 B1 | 12/2002 | Tang | |
| 6,696,890 B2 * | 2/2004 | Hedberg et al. | 330/9 |
| 6,750,704 B1 | 6/2004 | Connell et al. | |
| 6,781,450 B1 | 8/2004 | Mercer et al. | |
| 7,012,463 B2 * | 3/2006 | Nairn | 330/9 |
| 7,292,095 B2 | 11/2007 | Burt et al. | |
| 7,321,260 B2 | 1/2008 | Larson | |
| 7,382,183 B2 | 6/2008 | Nolan et al. | |
| 7,564,307 B2 | 7/2009 | Hunter et al. | |
| 7,642,846 B2 | 1/2010 | Yan | |
| 7,696,817 B1 | 4/2010 | Boucher et al. | |
| 7,834,685 B1 | 11/2010 | Pertijs | |
| 7,907,007 B2 | 3/2011 | Steele | |
| 2008/0246543 A1 | 10/2008 | Trifonov et al. | |

OTHER PUBLICATIONS

Pertijs, Michiel A. et al. "A 140 dB-CMRR Current-Feedback Instrumentation Amplifier Employing Ping-Pong Auto-Zeroing and Chopping" IEEE Journal of Solid-State Circuits, vol. 45, No. 10, pp. 2044-2056 (Oct. 1, 2100).
International Search Report and Written Opinion Issued for International Patent Application No. PCT/US2012/046192, completed on Sep. 20, 2012 and mailed Oct. 1, 2012.

\* cited by examiner

*Primary Examiner* — Steven J Mottola
(74) *Attorney, Agent, or Firm* — Knobbe Martens Olson & Bear LLP (57) ABSTRACT

An auto-zero amplifier includes a main amplifier for amplifying an input signal; the main amplifier receives an offset-correction signal for cancelling an offset at a first common-mode level of the input signal. At the first common-mode level, the offset-correction signal is based on a first value stored using a first offset-storage element. When a change is detected in the input common-mode from the first level to a second level, the first offset-storage element is switched out and a second offset-storage element, having a second value based on the second common-mode level, is switched in.

17 Claims, 10 Drawing Sheets

COMMON-MODE STEP RESPONSE FOR AUTOZERO AMPLIFIERS

CROSS-REFERENCE TO RELATED APPLICATIONS

This application claims priority to and the benefit of U.S. Provisional Patent Application Ser. No. 61/506,857, filed on Jul. 12, 2011, which is hereby incorporated herein by reference in its entirety.

TECHNICAL FIELD

Embodiments of the invention generally relate to auto-zero amplifiers and, in particular, to auto-zero amplifiers that compensate for large steps in their input common-mode level.

BACKGROUND

Figures 1A, 1B:
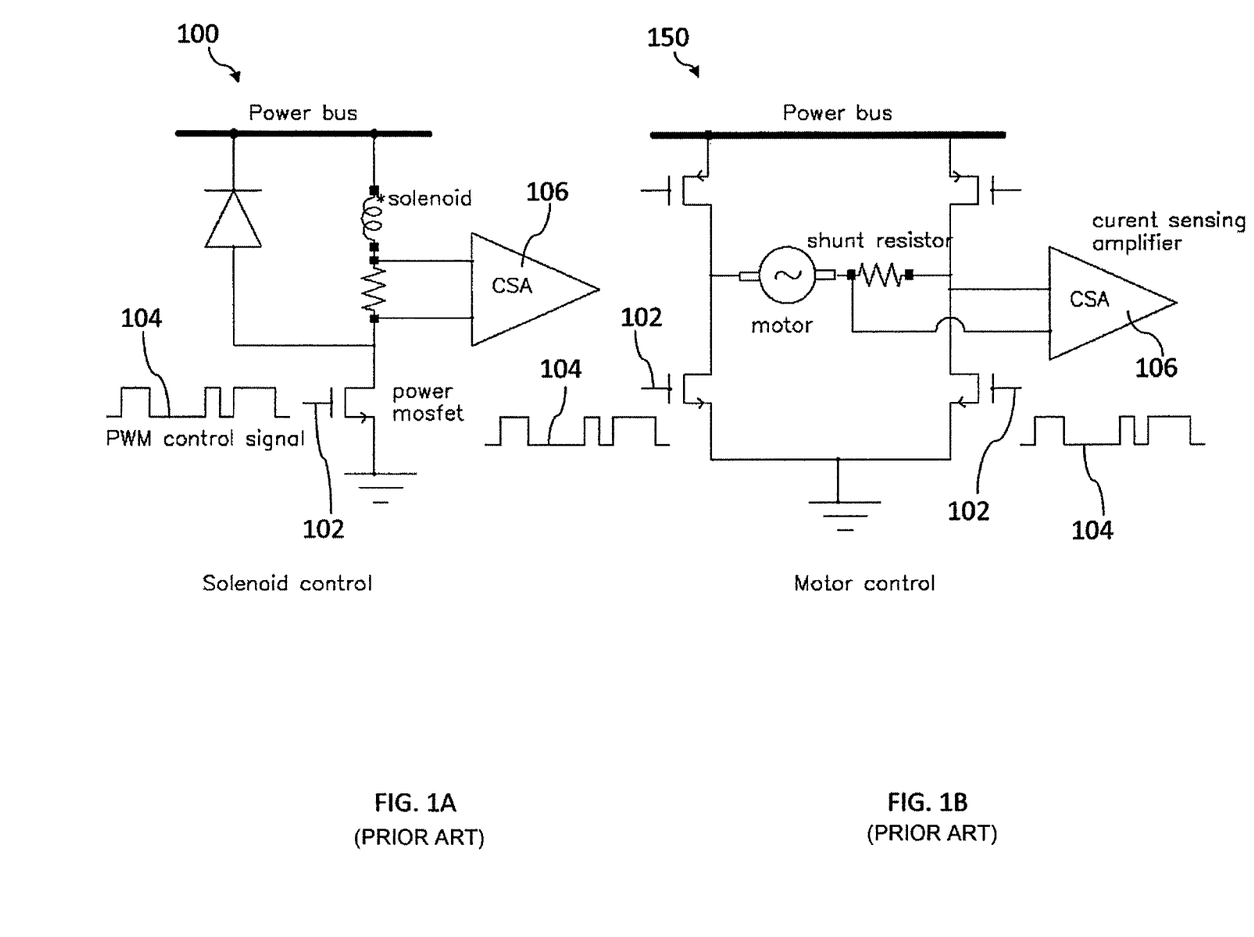
FIGS. 1A and 1B illustrate applications for current-sensing amplifiers.

Current-sensing amplifiers output a voltage proportional to an input current. They may use a resistor to convert the input current into a corresponding voltage, which is then amplified. Among many other applications, current-sensing amplifiers may be used for motor and solenoid control in, for example, automotive power-steering and adaptive-suspension systems, industrial-process control, and medical applications. FIGS. 1A and 1B illustrate diagrams of solenoid 100 and motor control 150 applications, respectively. In such applications, the input 102 receives a pulse-width modulated waveform 104 that toggles between (for example) −2 V and 24 V, 48 V, or 80 V. The rising and falling time of the transitions of the input 102 may be as small as approximately 10 nS, and the frequency of the input 102 may be as great as approximately 20 kHz. A current-sensing amplifier 106 in such applications may be judged on the offset (i.e., a difference between real and expected output values), drift (i.e., a change in output values despite constant input values), and common-mode step response of its output. Ideally, the amplifier 106 produces a result based on the difference between its inputs, regardless of the actual values of the inputs (i.e., their common-mode level); in practice, however, the output of the amplifier 106 may change at different common-mode levels of its inputs. For example, if the amplifier 106 is tuned to remove an offset at a first common-mode level, the tuning may need to be adjusted at a second common-mode level to remove a new offset introduced by the new common-mode level.

The common-mode step response of the amplifier 106 may be especially important in applications having large changes in the input common mode voltage; while the amplifier 106 is recovering from the change in input common mode voltage, the output of the amplifier may not be valid due to the new offset induced by the new common-mode level. Thus, a long settling time of the amplifier 106 (and thus the large error during that period of time) may seriously degrade the dynamic performance of the amplifier 106. In addition, such amplifiers typically have an unacceptably large DC offset, offset drift, and poor CMRR, thus making them unsuitable for precision applications.

Figure 2:
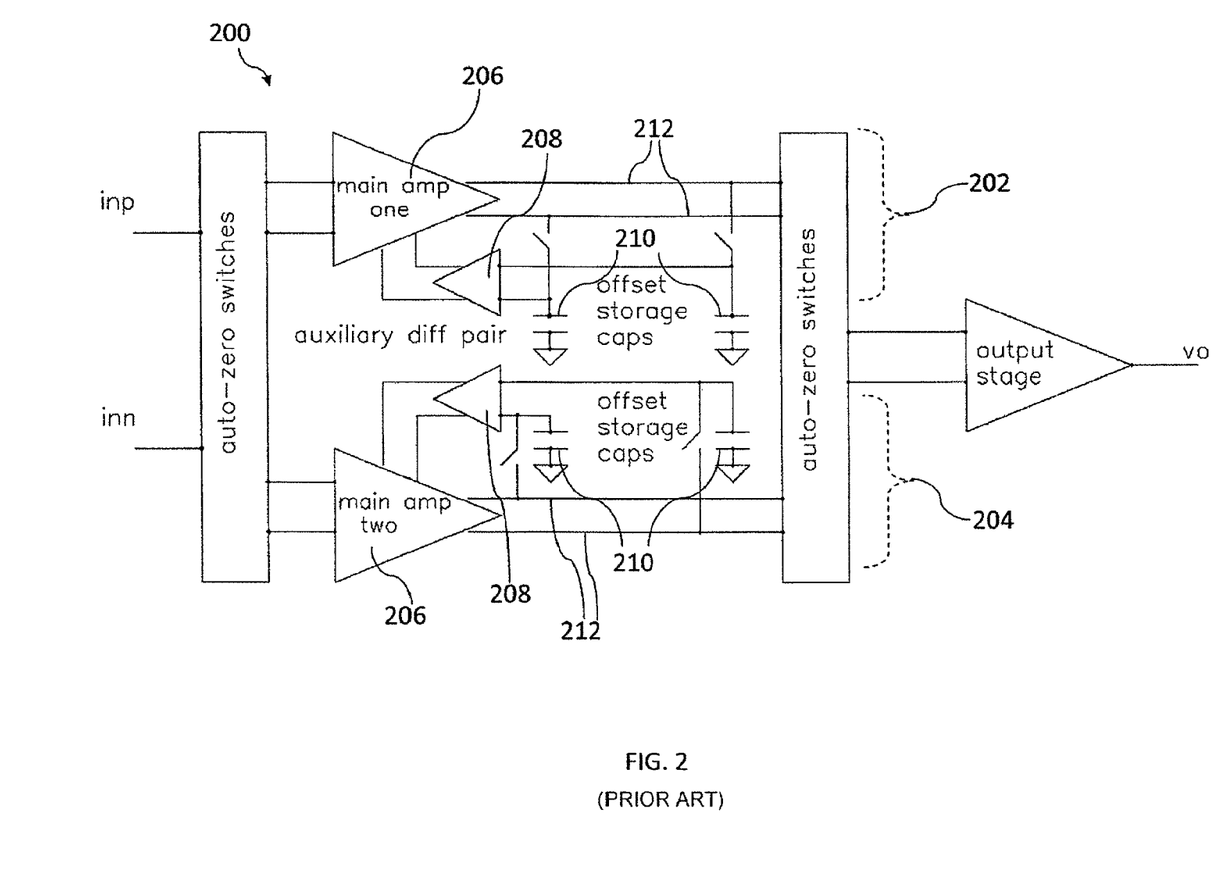
FIG. 2 illustrates a typical ping-pong auto-zero amplifier.

In order to improve the DC precision of the amplifier, an auto-zero technique may be used. FIG. 2 illustrates an example of a "ping-pong" auto-zero amplifier 200. It has two input paths 202, 204 disposed in parallel: each path 202, 204 includes a main amplifier 206, an auxiliary differential pair 208 to correct the offset of the main amplifier, and a pair 210 of offset-storage capacitors. The offset-storage capacitors 210 sample the voltage on the outputs 212 of the main amplifiers 206 and feed the samples back, via the auxiliary differential pairs 208, to tuning the main amplifiers 206 to correct any offset therein. Each path 202, 204 may be calibrated periodically and alternatively, in accordance with, for example, an auto-zero clock, so that the offset-correction voltage is refreshed periodically. In other words, while one path 202 is amplifying the input signal, the other path is calibrating itself, and vice-versa. Such an auto-zero amplifier 200 may achieve very low DC offset, offset drift, and high DC CMRR.

It may take a relatively long time, however, for a traditional auto-zero amplifier to recover (i.e., cancel a new offset) after a step in the input common-mode voltage and, during recovery, the output of the amplifier may be invalid. An offset in an amplifier may result from a mismatch between devices' transconductance and/or mismatching between devices' output impedance. The degree of mismatching may be affected by device bias current, MOSFET drain-to-source voltage and back-gate bias voltage, and/or bipolar transistor collector-to-emitter voltage. All of these factors may be affected by input common mode voltage. Because the amplifier typically has different offsets at different common-mode voltages, and thus requires different offset-correction voltages to correct these offsets, this long recovery time hinders the accuracy of the amplifier. The recovery time varies significantly: it may depend on the unpredictable timing relationship between the auto-zero cycle and input common mode step and/or the auto-zero clock frequency, which varies with temperature and process corner. In other words, if a sudden step in the input common-mode voltage occurs at a first time $t_0$ and creates an offset in the output of the auto-zero amplifier, it may not be corrected until a later time $t_1$ during the next auto-zero cycle. The times $t_0$ and $t_1$, and the length of time between them, may be unknown and unpredictable. Although the auto-zero frequency may be increased to reduce the length of such time, nevertheless, due to the discrete nature of auto-zero operation, the amplifier is still unable to start the settling process immediately after a common mode input step. Furthermore, in practice, the settling time of the auto-zero calibration loop, power consumption, switch charge injection, etc., may limit how fast the auto-zero frequency can be. Other techniques used to improve the DC accuracy of a current-sensing amplifier, such as chopper stabilization, have the same drawbacks due to, for example, the long settling time of a capacitor in an internal filter.

Figure 3:
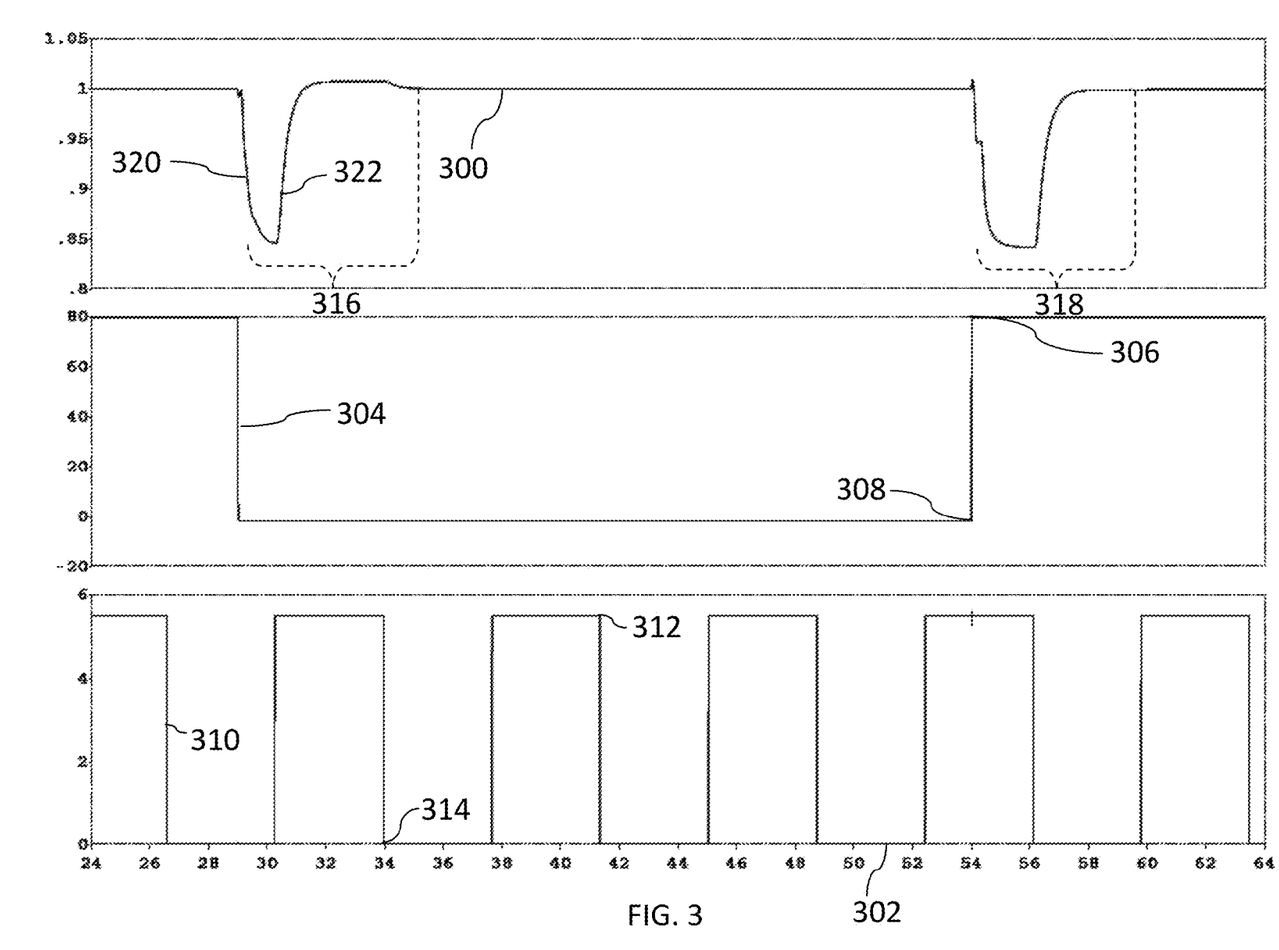
FIG. 3 illustrates an output of a typical auto-zero amplifier, given a large change in input common-mode voltage.

FIG. 3 illustrates a common-mode step response 300 of a traditional ping-pong auto-zero amplifier as a function of time 302 (in microseconds). An input common-mode voltage 304 toggles between a wide common-mode range (in this example, between −2 V 306 and 80 V 308, but the invention is not limited to these values); an auto-zero control logic signal 310 toggles between high 312 and low 314 values to enable and disable two paths of a ping-pong amplifier (such as the paths 202, 204 described above with reference to FIG. 2). When the control signal 310 is at logic high 312, a first ping-pong main amplifier is in auto-zero mode and the a second ping-pong main amplifier is in the signal path; conversely, when the control signal 310 is at logic low 314, the second ping-pong main amplifier is in auto-zero mode and the first ping-pong main amplifier is in the signal path. The output 300 of the overall amplifier is, in this example, configured to have a gain of 20.

As is shown in FIG. 3, the settling times 316, 318 of the output 300 in response to the transitions in the common-mode input 304 may be long and unpredictable. For example, at approximately 29 uS, the common-mode voltage 304 steps from 80 V down to −2V, and a large offset appears at the amplifier output 300; this offset persists until approximately 35 uS. The offset persists for so long because of the timing of the input step 304 and the auto-zero control 310. Between 29 uS and 30 uS, the first ping-pong main amplifier is in the signal path; its offset-correction voltage was calibrated, during its auto-zero mode, at a common-mode voltage of 80 V. Between 26.5 uS and 30.5 uS, the second main amplifier is in auto-zero mode. At 29 uS, however, the common-mode input 304 suddenly changes, which also changes the offset of the first and second main amplifiers. Between 29 uS and 30.5 uS, a very large error 320 (e.g., >150 mV) appears at the output 300 due to the sudden offset change of the first main amplifier resulting from the large change in the common-mode level of the input 304. During the same time, the second main amplifier also tries to find the new offset-correction voltage for the new common mode level; it has only 1.5 uS to do so, however. The second main amplifier does thus not have enough time to settle to the correct offset-correction voltage by the end of its auto-zero cycle. At 30.5 uS, the second main amplifier switches from auto-zero mode into the signal path, producing an undesirable offset 322 (e.g. a bump riding on the output 300) between approximately 30.5 uS and 35 uS. The output 300 finally settles at its correct value at 35 uS, after the first main amplifier is in auto-zero mode at −2V between 30.5 uS to 35 uS and then switches back into the signal path. The total common mode step recovery time is thus 6 uS. The next common-mode step happens at 54 uS; in this case, the overall recovery time is about 4 uS for similar reasons.

Thus, existing current-sensing amplifiers may not properly handle large steps in input common mode voltage. A need therefore exists for a cost-effective and precise way to compensate for large and/or fast changes in an input common-mode voltage.

SUMMARY

In general, various aspects of the systems and methods described herein include improving the settling time of an auto-zero amplifier. An offset-storage device (e.g., a capacitor for a single-ended implementation, a capacitor pair for a differential implementation, or a digital-register array if a corresponding offset-correction voltage has been converted into a digital format by analog to digital converters) is used for steady-state operation. One or more additional offset-storage devices are connected via a switching and control network to the offset-correction circuit; at least one additional offset-storage device (e.g., capacitor, capacitor pair, or digital resister array) is charged to a voltage corresponding to a level of the input common mode voltage after a step therein. The additional offset-storage device is switched to replace the steady-state offset-storage device after a step in the input voltage is detected and thereby settles the voltage of the amplifier more quickly. The amplifier may be an auto-zero amplifier or any other amplifier that may be subjected to an input common-mode voltage having large steps and that implements either an internal auto-offset adjustment or externally applied adjustment. Furthermore, the offset adjustment is not limited to implementation in the analog domain. In one embodiment, the offset corresponding each common mode input level may be converted to a digital format by an analog-to-digital converter, stored in digital register arrays, and converted back into analog to cancel the offset of the amplifier by a digital-to-analog conversion circuit. In other embodiments, the output of the amplifier may be converted to one or more digital signals, and the offset-correction may be done completely in the digital domain with digital register arrays that store an offset-correction voltage corresponding to each common mode input level during calibration mode.

In one aspect, a system for improving common-mode response of an auto-zero amplifier includes a first offset-storage element for storing a first value corresponding to a first common-mode level of an input signal and a second offset-storage element for storing a second value corresponding to a second common-mode level of the input signal. A main amplifier amplifies the input signal; it receives an offset-correction signal, generated based on the first value, for cancelling an offset at the first common-mode level. Control logic detects a transition in the input signal from the first common-mode level to the second common-mode level, and a switch (upon detection of the transition) severs a first connection to the first offset-storage element and creates a second connection to the second offset-storage element, thereby generating the offset-correction signal using the second value instead of the first value.

In various embodiments, the first and second offset-storage elements are capacitors or digital registers. The switch may sever and create the first and second connections immediately upon detection of the transition when the main amplifier is in a signal-path mode and/or during a next transition of an auto-zero clock when the main amplifier is in an auto-zero mode. The auto-zero amplifier may be a ping-pong auto-zero amplifier. The main amplifier, first and second steady-state offset-storage elements, control logic, and switch may comprise one of two paths in the ping-pong auto-zero amplifier; the system may further include a second path comprising a second main amplifier, second first and second offset-storage elements, a second control logic, and a second switch. An auto-zero clock may be used for switching between the first path and the second path.

A third offset-storage element may store a third value corresponding to the first common-mode level of the input signal; the control logic may detect a second transition in the input signal from the second common-mode level back to the first common-mode level, and the switch may sever the first or second connections and create a third connection to the third offset-storage element. An auxiliary differential pair may generate the offset-correction signal in accordance with the values of the first or second offset-storage elements.

The system may further include (i) a first auxiliary differential pair for generating the offset-correction signal, in accordance with the value of the second offset-storage element, for low-to-high transitions of the common-mode level of the input signal and (ii) a second auxiliary differential pair for generating the offset-correction signal, in accordance with a value of a third settling offset-storage element, for high-to-low transitions of the common-mode level of the input signal. A third auxiliary differential pair may generate the offset-correction signal, in accordance with the value of the first offset-storage element, during a steady-state of the common-mode level of the input signal.

In another aspect, a method for improving common-mode response in an auto-zero amplifier includes generating an offset-correction signal for correcting an offset in a main amplifier; the offset-correction signal depends at least in part on a first value corresponding to a first common-mode level of an input signal. A change in the common-mode level of the input signal from the first common-mode level to a second common-mode level is detected, and (upon detection) the first value is switched for a second value previously stored for the second common-mode voltage level, thereby modifying the offset-correction signal. The modified offset-correction signal is applied to the main amplifier to thereby cancel a new offset introduced by the change in the common-mode level.

In various embodiments, the method further includes (i) detecting a second change in the input common-mode level of the signal input from the second common-mode level back to the first common-mode level, (ii) switching, in response to the detected second change, the first or second value with a third value previously stored for the first common-mode voltage level; and (iii) applying the modified offset-correction signal to the main amplifier to thereby cancel a new offset introduced by the second change in the common-mode level. The switching may occur immediately after detecting the change if the main amplifier is in a signal-path mode or after a next transition in an auto-zero clock if the main amplifier is in an auto-zero mode. The second offset-storage element may be disconnected prior to the input common-mode voltage changing from the second voltage level. The first and second values may be stored in capacitors or digital registers, and the second value may be stored prior to the detected change. The storing of the second value may occur during an auto-zero mode.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

Figure 4:
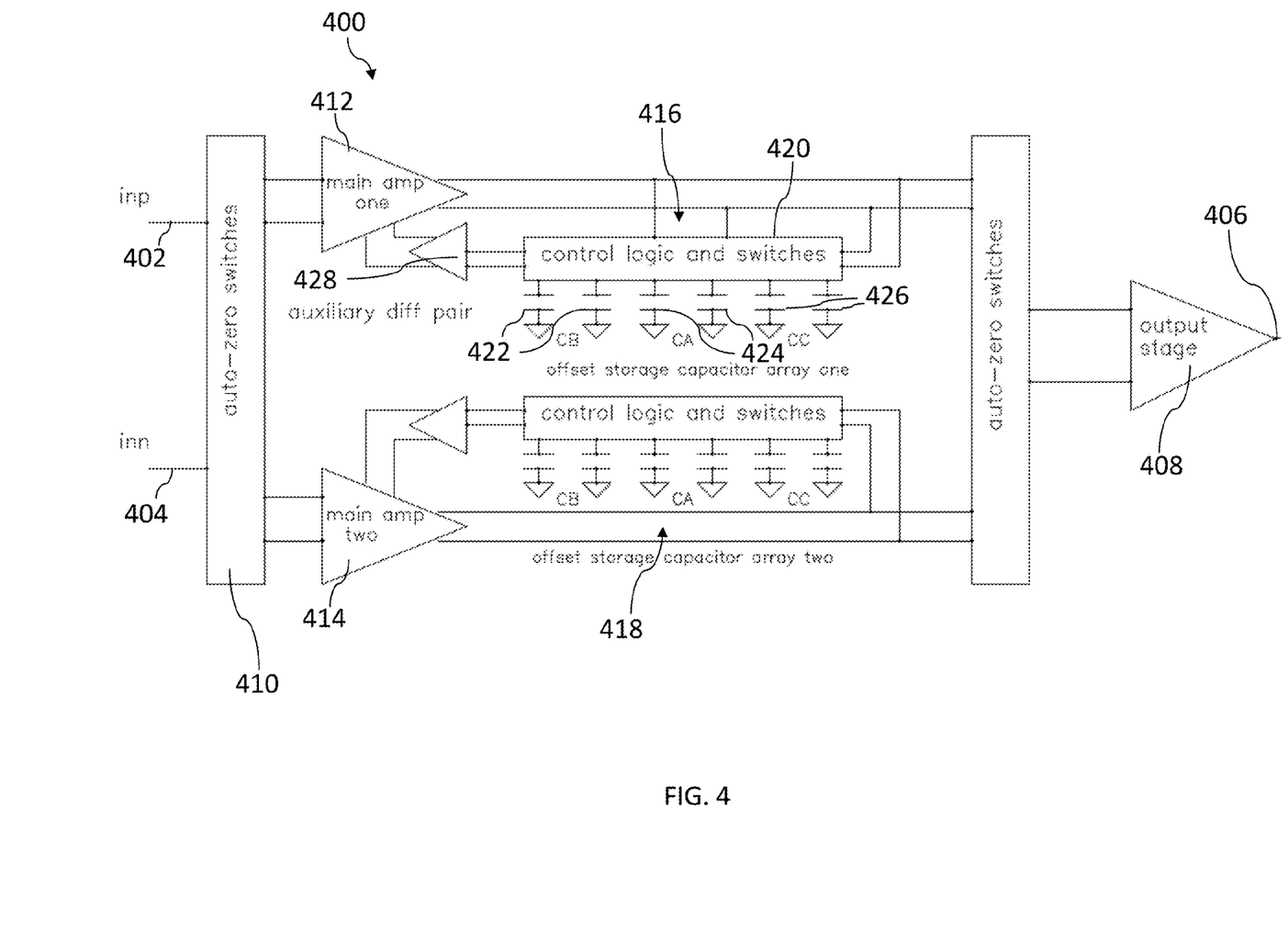
FIG. 4 illustrates an auto-zero amplifier in accordance with an embodiment of the invention.

One embodiment of the present invention may be used in a ping-pong auto-zero amplifier. FIG. 4 illustrates an auto-zero amplifier 400 that receives input signals 402, 404 and provides an output signal 406 via an output stage 408. Auto-zero switches 410 select one of a first amplifier 412 and a second amplifier 414; while one amplifier 412, 414 is in the signal path, the other amplifier 412, 414 is in auto-zero mode. Each amplifier 412, 414 has a offset calibration circuit 416, 418 that includes control logic and switches 420 and capacitor pairs CB 422, CA 424, and CC 426. The output of the control logic and switches 420 is applied to an auxiliary differential pair 428 and fed back to the amplifiers 412, 414.

The first pair of offset-storage capacitors CB 422 may be used for steady-state operation in a manner similar to the capacitors in a traditional ping-pong auto-zero amplifier. A second pair of offset-storage capacitors CA 424 may be used to improve the amplifier settling behavior after the common mode steps from low voltage to high voltage, for instance, from −2V to 80V or vice versa. A third pair of offset-storage capacitors CC 426 may be used to improve the amplifier settling behavior after the common mode steps from high voltage to low voltage, for instance, from 80V to −2V. The control logic and switches 420 detect the common-mode voltage before and after the step and switch in or out the capacitors CA, CB, CC appropriately.

Figure 5A:
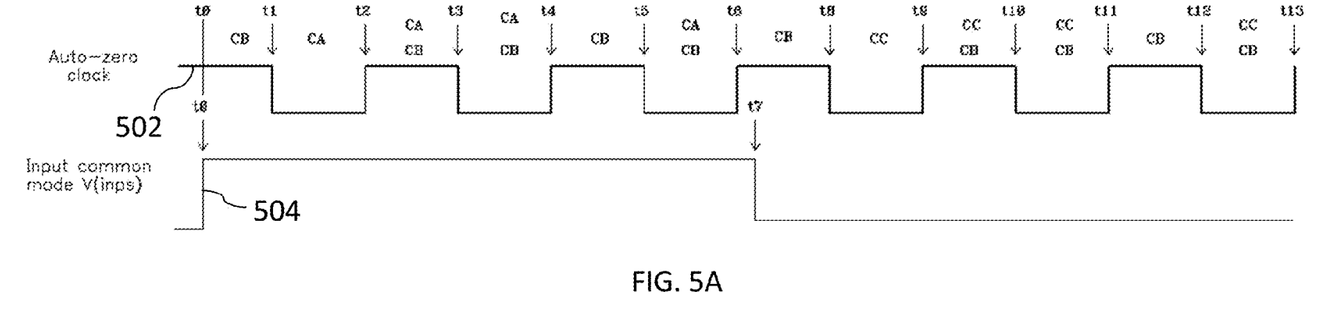
FIGS. 5A and 5B illustrate signal timing for input common-mode changes in accordance with embodiments of the invention.
Figure 5B:
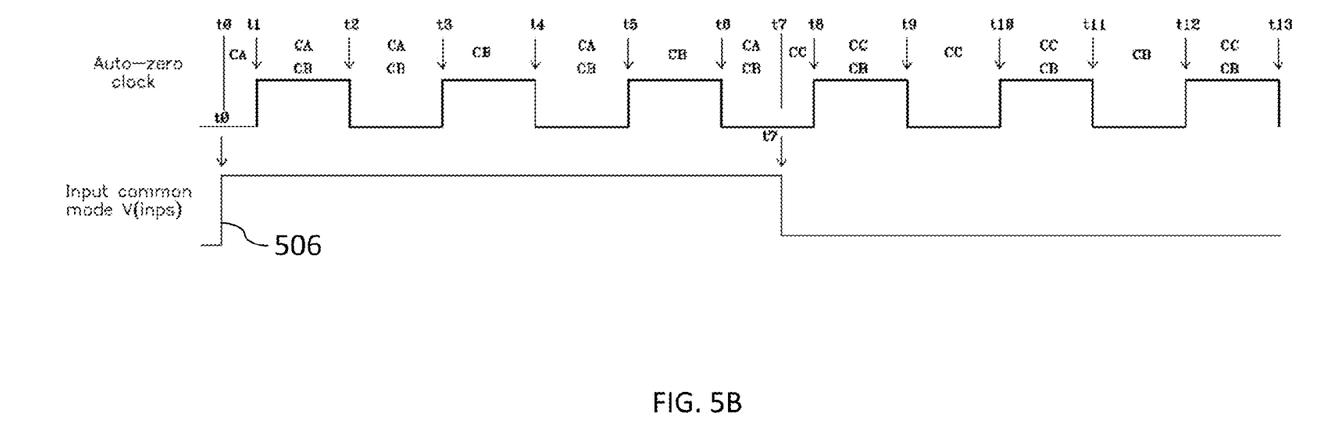

The step in the common-mode voltage may occur either when the first amplifier 412 is in auto-zero mode or when it is in the signal path, and FIGS. 5A and 5B illustrate each of these cases, respectively. Although FIGS. 5A and 5B pertain only to the first amplifier 412, the principles embodied therein may be applied to the second amplifier 414 or any other amplifiers built in accordance with the present invention.

Referring first to FIG. 5A, at time $t_0$, the common-mode voltage 504 steps up from −2V to 80V; at this time, the first amplifier 412 is in auto-zero mode (in accordance with the auto-zero clock 502 being high). The first amplifier 412 transitions to being in the signal path at time $t_1$ when the auto-zero clock 502 falls low. Because the common-mode voltage 504 has changed, so too does the offset of the first amplifier 412; because the time duration from $t_0$ is $t_1$ is unpredictable (i.e., there is no relationship or dependency between the transitions in the clock 502 and input common mode 504), the auto-zero loop may not have enough time to settle. Therefore, CB 422 alone may not remove the amplifier offset corresponding to a common-mode voltage of 80 V at $t_1$. If, however, CA 424 has previously stored the offset-correction voltage corresponding to an 80 V common-mode voltage, then at time $t_1$ CB 422 may be switched out and CA 424 switched in. At time $t_2$, the auto-zero clock 502 rises again, and the first amplifier 412 again enters auto-zero mode. At this time, both CA 424 and CB 422 may be switched in. By time $t_3$, the offset-correction voltage in CA 424 is refreshed and ready for the next low-to-high common-mode transient. Once CB 422 is switched in at time $t_2$, it may stay switched in until the next common-mode step occurs, regardless of the present mode of the first amplifier 412. During this time, CB 422 may function in a manner similar to the normal offset-storage capacitor in a traditional auto-zero amplifier.

After time $t_3$, CA 424 may be switched out until the common-mode steps down and steps back to 80 V again; in another embodiment, it is switched out during only the auto-zero periods because, during this period, voltage in the offset-storage capacitors may be disturbed. In either case, CA 424 is switched out from the auto-zero loop before the common-mode voltage changes again (at time $t_7$) so that its sampled voltage is not corrupted by the new common-mode voltage. The common mode steps from high to low at time $t_7$. At this time, the first amplifier 412 is also in the auto-zero mode. CB 422 and CC 426 may be switched in and out in the same manner as CB 422 and CA 424, where CC 426 stores the offset correction voltage for the common mode of −2V.

The step in the input common-mode voltage may also occur while the first amplifier 412 is in the signal path, as illustrated in FIG. 5B. The common-mode level 506 steps from low to high at time $t_0$. Before $t_0$, the system switches in only CC 426 and CB 422 or only CB 422. After the step in the common-mode level, the offset of the first amplifier 412 changes. The offset-correction voltage stored in CC 426 and CB 422, which corresponds to the previous common-mode level, is unable to fully correct the offset of the main amplifier at the new level. Therefore, at time t0, CC 426 and CB 422 are switched out and CA 424 is switched in; CA 424 has been previously sampled to store the offset correction voltage corresponding to a common-mode level of 80 V. The common-mode level steps down at time $t_7$ when, as described above, the first amplifier 412 is in the signal path. At this time, CC 426 is switched in and the other capacitors CA, CB 424, 422 are switched out. Thus, the discrete nature of the auto-zero scheme and its limited intrinsic CMRR no longer degrade the common-mode step response.

Figure 6:
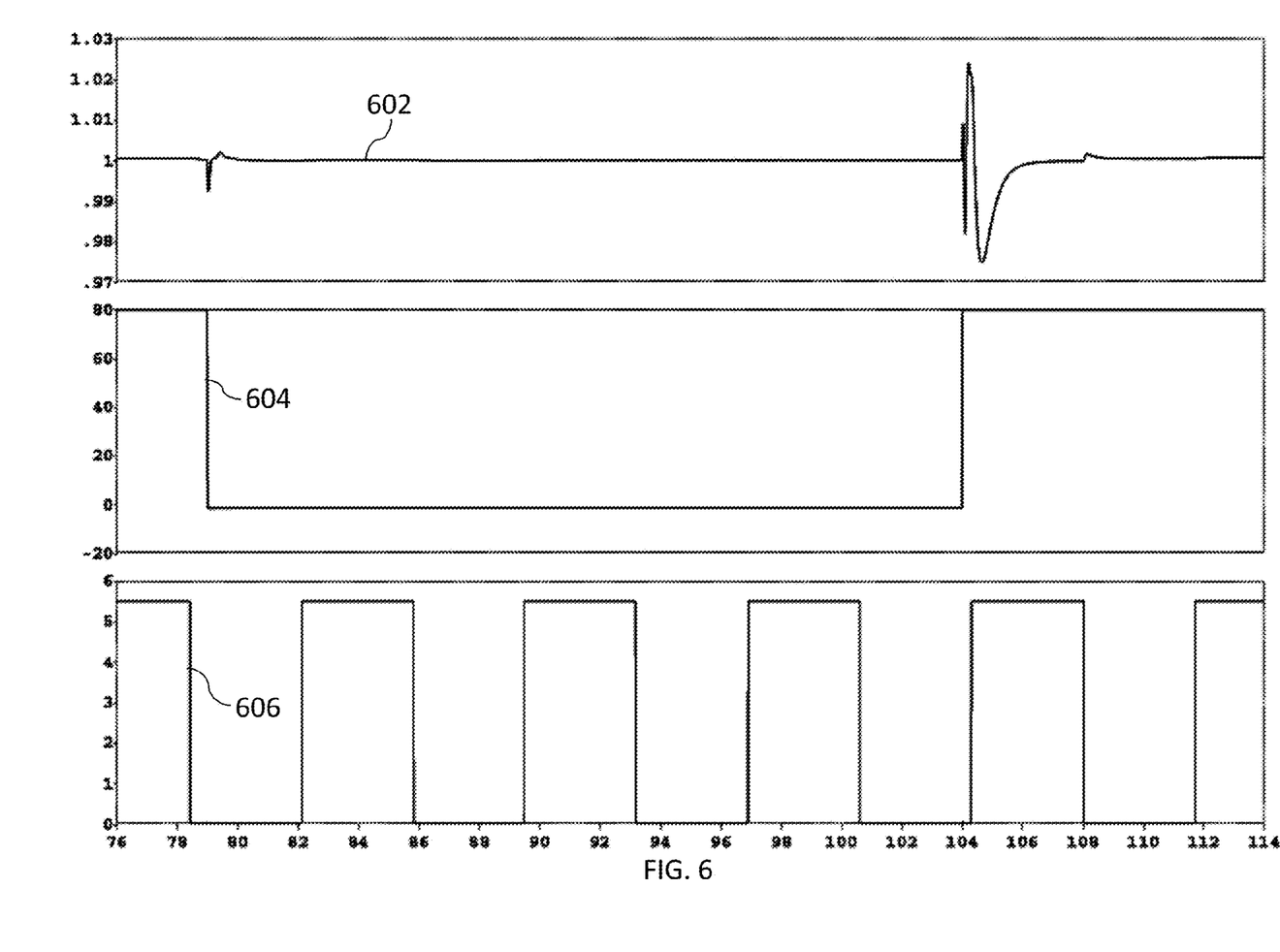
FIG. 6 illustrates an output of an auto-zero amplifier in accordance with an embodiment of the invention.
Figure 7:
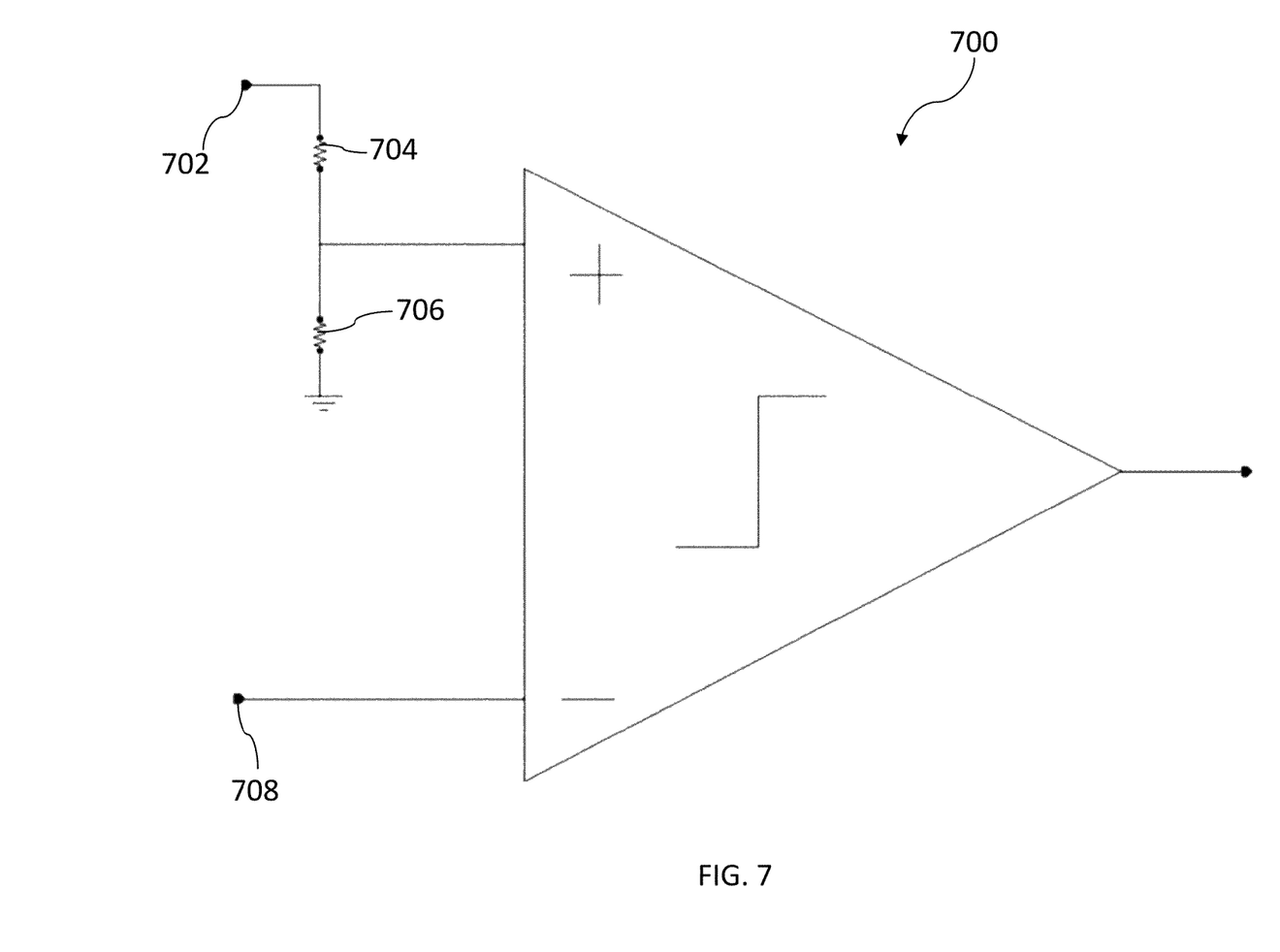
FIG. 7 illustrates a common-mode detection circuit in accordance with an embodiment of the invention.

FIG. 6 shows an exemplary common-mode step response 602, with respect to an input common-mode level 604 and an auto-zero clock 606, using the auto-zero architecture of the present invention. FIG. 7 shows one embodiment of a common-mode detection circuit 700; in this circuit, the common-mode input voltage 702 is scaled down by two resistors 704, 706 and compared with a reference voltage 708.

Figure 8A:
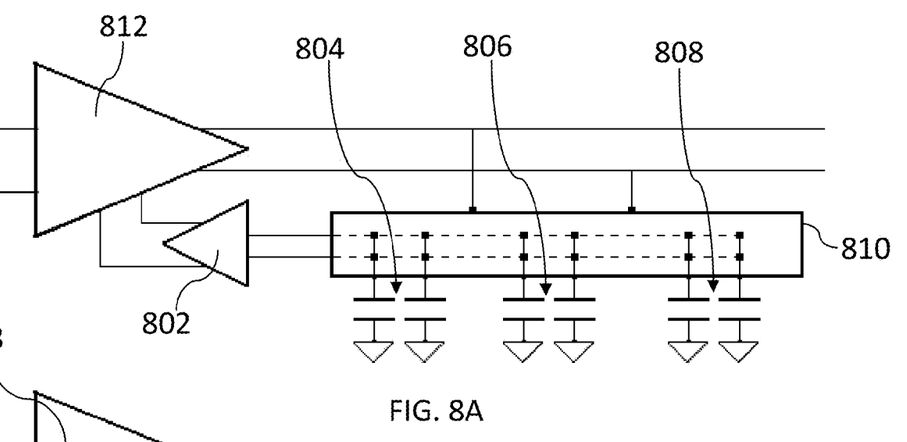
FIGS. 8A-8D illustrate auto-zero amplifiers having multiple auxiliary amplifiers in accordance with embodiments of the invention.

In the above-described embodiments, one auxiliary differential pair having three pairs of capacitors is used for offset correction for each main amplifier. FIG. 8A is a diagram of such an auxiliary differential pair 802, showing its use of each of three pairs of capacitors 804, 806, 808 (via a switching network 810) and a main amplifier 812. Note that the connections in the switching network 810 represent merely the relationship between the auxiliary amplifier 802 and the capacitors 804, 806, 808, and are not intended to illustrate the actual switching circuits in the network 810.

Figure 8B:
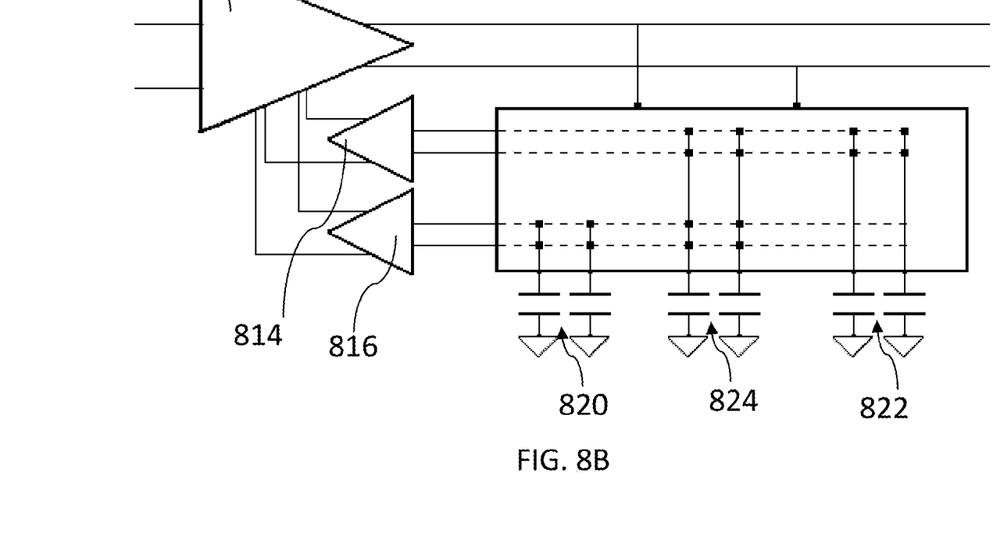
Figure 8C:
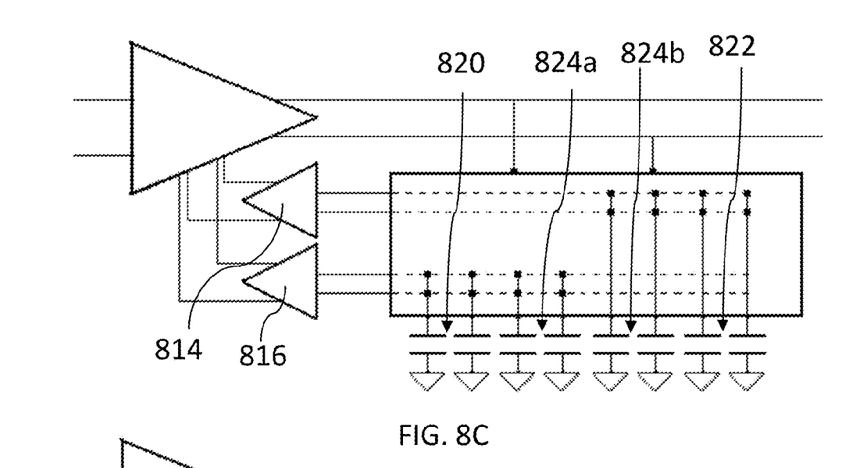

In other embodiments, one of which is shown in FIG. 8B, two auxiliary differential pairs 814, 816 may be used with a main amplifier 818 (i.e., a total of four auxiliary differential pairs are used in the full circuit). A first auxiliary pair 814 may be used to improve the low-to-high common-mode step response (using, e.g., a first capacitor pair 820) and a second auxiliary pair 816 may be used to improve the high-to-low transient (using, e.g., a second capacitor pair 822). The two auxiliary pairs 814, 816 may share a third pair of capacitors 824 for steady-state operation. In an alternative embodiment, illustrated in FIG. 8C, the two differential pairs 814, 816 have their own, separate steady-state capacitors 824a, 824b.

Figure 8D:
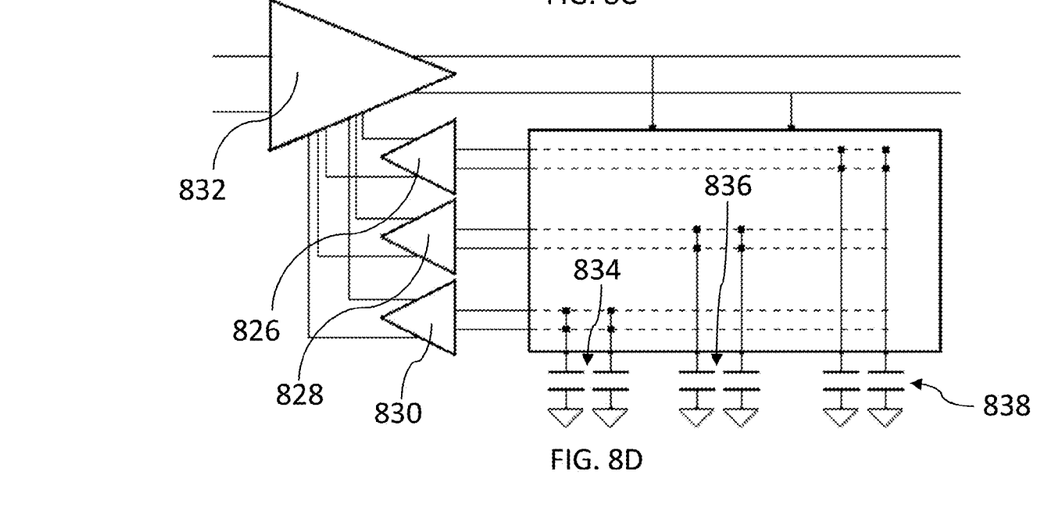

In other embodiments, one of which is shown in FIG. 8D, three auxiliary differential pairs 826, 828, 830 may be used with a main amplifier 832. Each auxiliary pair 826, 828, 830 may have its own offset-storage capacitor pair 834, 836, 838. A first auxiliary pair 826 improves the low-to-high common-mode step response with a first capacitor pair 838, a second auxiliary pair 828 improves the high-to-low transient using a second capacitor pair 836, and a third auxiliary pair 830 uses a third capacitor pair 834 for steady-state operation.

Figure 9:
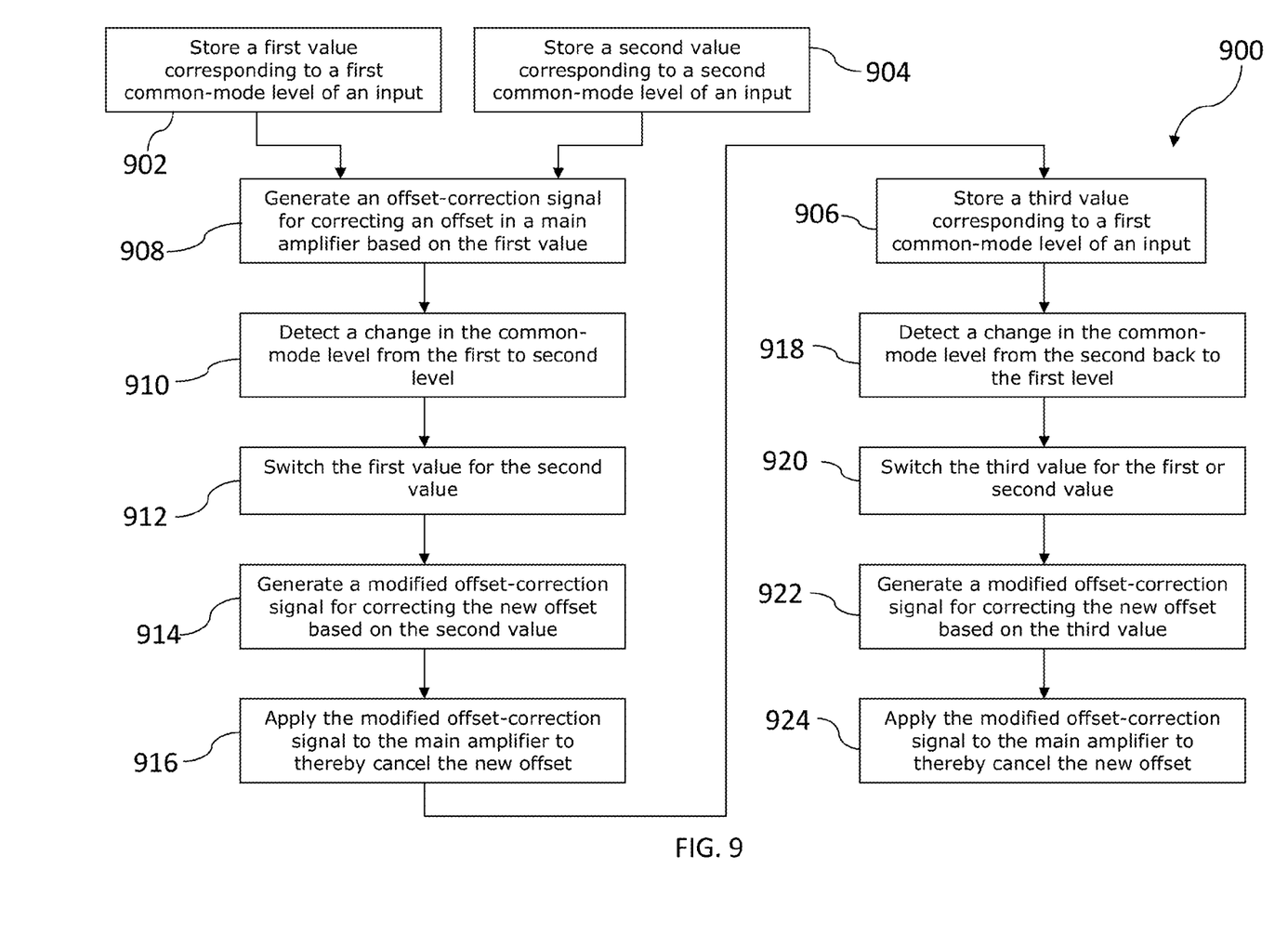
FIG. 9 is a flowchart of a method for improving common-mode step response of an auto-zero amplifier in accordance with an embodiment of the invention.

A method 900 for improving common-mode step response in an auto-zero amplifier is illustrated in FIG. 9. In first steps 902, 904, 906, first, second, and third values are sampled and/or stored at various common-mode levels (e.g., two or more levels). As explained above, if the input common mode is at a first level and a change to a second level is anticipated, and least one value has already been stored that corresponds to the second level (during, e.g., the last time the input common-mode was at the second level). In a second step 908, an offset-correction signal is generated for correcting an offset in the main amplifier; this offset-generation signal may be generated using the first value stored on, e.g. the steady-state capacitors CB described above. The input signal is monitored (using, e.g., the control logic described above) for a change to a second level (step 910) and, once that change is detected, the first value is switched (step 912) for the second value using, e.g., the switches described above. The switch may occur immediately after detection of the change (if, for example, the main amplifier is in a signal-path mode) or at the next time the main amplifier exits auto-zero mode to enter signal-path mode (i.e., the next time the auto-zero clock transitions) if the main amplifier is in auto-zero mode. The offset-correction signal is then modified (step 914) accordingly and applied (step 916) to the main amplifier to correct the new offset.

Steps 902-916 describe the detection and correction of a single transition in an input common-mode level; the current invention is capable, however, of detecting and correcting any number of transitions. For example, the input common-mode level may toggle, at known or unknown intervals in time, between two levels; the preceding discussion may be extended, as one of skill in the art will understand, to apply to ongoing monitoring and correction of an input common-mode level. For example, after the first transition is detected (step 910), a second transition back to the first common-mode level may be detected (step 918). A third value, which was previously stored (step 906) is then switched (step 920) for the first and/or second value (whichever one, or both, is currently being used). The offset-correction signal is again modified (step 922) and applied (924) to correct the new offset.

As described above, the method 900 describes correcting an offset in one path of an auto-zero amplifier; as one of skill in the art will understand, the method 900 may be applied to the other half of the amplifier. In accordance with an auto-zero clock, the main amplifier in a first half of the auto-zero amplifier may be in an auto-zero mode (and thus sampling one or more of the first, second, and third values) while the other main amplifier is in a signal-path mode (and thus actively amplifying an input signal).

The methods described above store the offset-correction voltage in capacitors; the current invention, however, is not limited to any particular method of storage. For example, the offset-correction voltage may also be converted to digital format by an analog-to-digital converter; in this embodiment, digital register arrays may be used as offset-storage devices.

In the above embodiments, the common-mode level steps up and down between only two levels (e.g., −2 V to 24 V, −2 V to 40 V, or −2 V to 76 V). In other embodiments, the common-mode level steps up and down between more than two (e.g., eight) different levels; in these embodiments, more than two (e.g., eight) extra offset-storage devices are used to store the offset-correction voltage for each common-mode level, and the offset-storage devices may be switched in and out in accordance with the methods described above.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A system for improving common-mode response of an auto-zero amplifier, the system comprising:
   a first offset-storage element for storing a first value corresponding to a first common-mode level of an input signal;

a second offset-storage element for storing a second value corresponding to a second common-mode level of the input signal;

a main amplifier for amplifying the input signal, the main amplifier receiving an offset-correction signal, generated based on the first value, for cancelling an offset at the first common-mode level;

control logic for detecting a transition in the input signal from the first common-mode level to the second common-mode level; and a switch for, upon detection of the transition, severing a first connection to the first offset-storage element and creating a second connection to the second offset-storage element, thereby generating the offset-correction signal using the second value instead of the first value.

2. The system of claim 1, wherein the first and second offset-storage elements are capacitors or digital registers.

3. The system of claim 1, wherein the switch severs and creates the first and second connections immediately upon detection of the transition when the main amplifier is in a signal-path mode and during a next transition of an auto-zero clock when the main amplifier is in an auto-zero mode.

4. The system of claim 1, wherein the auto-zero amplifier is a ping-pong auto-zero amplifier.

5. The system of claim 4, wherein the main amplifier, first and second steady-state offset-storage elements, control logic, and switch comprise one of two paths in the ping-pong auto-zero amplifier, and wherein the system further comprises a second path comprising a second main amplifier, second first and second offset-storage elements, a second control logic, and a second switch.

6. The system of claim 5, further comprising an auto-zero clock for switching between the first path and the second path.

7. The system of claim 1, further comprising a third offset-storage element for storing a third value corresponding to the first common-mode level of the input signal, wherein the control logic detects a second transition in the input signal from the second common-mode level back to the first common-mode level, and wherein the switch severs the first or second connections and creates a third connection to the third offset-storage element.

8. The system of claim 1, further comprising an auxiliary differential pair for generating the offset-correction signal in accordance with the values of the first or second offset-storage elements.

9. The system of claim 1, further comprising (i) a first auxiliary differential pair for generating the offset-correction signal, in accordance with the value of the second offset-storage element, for low-to-high transitions of the common-mode level of the input signal and (ii) a second auxiliary differential pair for generating the offset-correction signal, in accordance with a value of a third settling offset-storage element, for high-to-low transitions of the common-mode level of the input signal.

10. The system of claim 9, further comprising a third auxiliary differential pair for generating the offset-correction signal, in accordance with the value of the first offset-storage element, during a steady-state of the common-mode level of the input signal.

11. A method for improving common-mode response in an auto-zero amplifier, the method comprising:

generating an offset-correction signal for correcting an offset in a main amplifier, the offset-correction signal depending at least in part on a first value corresponding to a first common-mode level of an input signal;

detecting a change in the common-mode level of the input signal from the first common-mode level to a second common-mode level;

switching, in response to the detected change, the first value for a second value previously stored for the second common-mode voltage level, thereby modifying the offset-correction signal; and applying the modified offset-correction signal to the main amplifier to thereby cancel a new offset introduced by the change in the common-mode level.

12. The method of claim 11, further comprising (i) detecting a second change in the input common-mode level of the signal input from the second common-mode level back to the first common-mode level, (ii) switching, in response to the detected second change, the first or second value with a third value previously stored for the first common-mode voltage level; and (iii) applying the modified offset-correction signal to the main amplifier to thereby cancel a new offset introduced by the second change in the common-mode level.

13. The method of claim 11, wherein the switching occurs immediately after detecting the change if the main amplifier is in a signal-path mode and after a next transition in an auto-zero clock if the main amplifier is in an auto-zero mode.

14. The method of claim 11, further comprising disconnecting the second offset-storage element prior to the input common-mode voltage changing from the second voltage level.

15. The method of claim 11, further comprising storing the first and second values in capacitors or digital registers.

16. The method of claim 11, further comprising storing the second value prior to the detected change.

17. The method of claim 16, wherein the storing of the second value occurs during an auto-zero mode.

* * * * *